(12) United States Patent
Herbert (10) Patent No.: US 7,915,967 B2
(45) Date of Patent: Mar. 29, 2011

(54) FREQUENCY-TUNABLE OSCILLATOR ARRANGEMENT

(75) Inventor: Arnaud Herbert, Cheux (FR)

(73) Assignee: NXP B.V., Eindhoven (NL)

( * ) Notice: Subject to any disclaimer, the term of this patent is extended or adjusted under 35 U.S.C. 154(b) by 754 days.

(21) Appl. No.: 11/576,461

(22) PCT Filed: Sep. 21, 2005

(86) PCT No.: PCT/IB2005/053112
§ 371 (c)(1),
(2), (4) Date: Oct. 12, 2007

(87) PCT Pub. No.: WO2006/035372
PCT Pub. Date: Apr. 6, 2006

(65) Prior Publication Data
US 2008/0164957 A1  Jul. 10, 2008

(30) Foreign Application Priority Data

Sep. 30, 2004 (EP) .................................... 04300645

(51) Int. Cl.
*H03B 5/08* (2006.01)
(52) U.S. Cl. .. 331/167; 331/57; 331/117 R; 331/117 FE
(58) Field of Classification Search .................. 331/57, 331/167, 117 R, 117 FE
See application file for complete search history.

(56) References Cited

U.S. PATENT DOCUMENTS

| | | | |
|---|---|---|---|
| 6,016,082 A | 1/2000 | Cruz et al. | 331/117 FE |
| 2003/0014679 A1 | 1/2003 | Domon | |
| 2003/0146795 A1 | 1/2003 | Domon | 331/36 C |
| 2004/0100339 A1 | 5/2004 | Feilkas et al. | 331/175 |

FOREIGN PATENT DOCUMENTS

| | | |
|---|---|---|
| CN | 2489526 Y | 5/2002 |
| EP | 1244215 A | 9/2002 |
| EP | 1333574 A | 8/2003 |
| WO | 01/67604 | 9/2001 |
| WO | WO02/097965 A | 12/2002 |
| WO | WO0297965 A | 12/2002 |

OTHER PUBLICATIONS

Grubbs, G. et al. "TV, FM Radio and Weather Band Receiver With Integrated Tuning," Proc. of the Int'l. Conf. on Consumer Electronics, vol. Conf. 10, pp. 100-101 (Jun. 5, 1991).
Office Action from Chinese patent appln. No. 200580032881.4, with English translation (Nov. 27, 2009).

*Primary Examiner* — Arnold Kinkead (57) ABSTRACT

A frequency-tunable arrangement comprises a resonance circuit having a capacitive part that is tunable throughout a capacitance range. A plurality of amplifiers is coupled to the resonance circuit so as to form an oscillation loop. At least one of the amplifiers is a switchable amplifier that is switchable between an active state and an idle state. The switchable amplifier causes a capacitance variation in parallel to the capacitive part of the resonance circuit when switched between the active and the idle state. The switchable amplifier is arranged so that the capacitance variation substantially corresponds to the capacitance range throughout which the capacitive part can be tuned.

10 Claims, 6 Drawing Sheets

|  | Vs1 | Vs2 | Vs3 | Camp (fF) | Δ Camp (fF) |
|---|---|---|---|---|---|
| S0 | 0 | 0 | 0 | 170 |  |
| S1 | 1 | 0 | 0 | 220 | 50 (AS1) |
| S2 | 1 | 1 | 0 | 270 | 50 (AS2) |
| S3 | 1 | 1 | 1 | 320 | 50 (AS3) |

FREQUENCY-TUNABLE OSCILLATOR ARRANGEMENT

FIELD OF THE INVENTION

An aspect of the invention relates to a frequency-tunable arrangement. The frequency-tunable arrangement may be, for example, a receiver for receiving a radiofrequency signal that conveys information in the form of audio, video, or other data or any combination of those. Other aspects of the invention relate to a method of tuning, a computer program product for a frequency-tunable arrangement, and an information-rendering apparatus comprising a frequency-tunable arrangement. The information-rendering apparatus may be, for example, a video display set.

BACKGROUND OF THE INVENTION

United States patent application 2003/0146795 describes an oscillator that comprises switched capacitors and varactors (voltage-dependent capacitors). The switched capacitors provide coarse tuning and the voltage-dependent capacitors provide fine-tuning in a frequency range from 1 to 2 GHz. The oscillator further comprises an amplifier comprising a number of switchable amplifier elements. Each amplifier element is switched on or off depending on the frequency at which the oscillator is oscillating, so as to maintain the transconductance of the amplifier elements within certain limits.

SUMMARY OF THE INVENTION

It is an object of the invention to provide satisfactory signal quality at moderate cost. The invention is defined by the independent claims. The dependent claims define advantageous embodiments.

According to an aspect of the invention, a frequency-tunable arrangement has the following characteristics. A frequency-tunable arrangement comprises a resonance circuit having a capacitive part that is tunable throughout a capacitance range. A plurality of amplifiers is coupled to the resonance circuit so as to form an oscillation loop. At least one of the amplifiers is a switchable amplifier that is switchable between an active state and an idle state. The switchable amplifier causes a capacitance variation in parallel to the capacitive part of the resonance circuit when switched between the active and the idle state. The switchable amplifier is arranged so that the capacitance variation substantially corresponds to the capacitance range throughout which the capacitive part can be tuned.

The invention takes the following aspects into consideration. A tunable resonance circuit typically comprises a fixed inductive part and a tunable capacitive part. That is, the capacitive part can be tuned between a minimum value and a maximum. These values define a frequency range throughout which the tunable resonance circuit can be tuned. The tunable capacitive part may comprise, for example, a voltage-dependent capacitor that receives a tuning voltage. The tunable capacitive part may further comprise switched capacitors. A switched capacitor is basically a capacitor and a controllable switch coupled in series. Switched capacitors allow a relatively large tuning range. The aforementioned prior art is an example of such an approach.

Switched capacitors may adversely affect signal quality. A controllable switch has a certain resistance when the controllable switch is in a closed state. Consequently, the controllable switch introduces noise. Furthermore, the resistance will generally be voltage-dependent to a certain extent. This introduces distortion. It may be possible to design the controllable switch so that the noise and the distortion are at an acceptable level. However, the controllable switch thus designed will generally be relatively expensive. It may even prove to be impossible to design the controllable switch so that the noise and distortion is at an acceptable level.

In accordance with the aforementioned aspect of the invention, the frequency-tunable arrangement comprises a switchable amplifier that is switchable between an active state and an idle state. The switchable amplifier causes a capacitance variation in parallel to the capacitive part of the resonance circuit when switched between the active and the idle state. The switchable amplifier is arranged so that the capacitance variation substantially corresponds to the capacitance range throughout which the capacitive part can be tuned.

Accordingly, the switching of the switchable amplifier causes a relatively large capacitance variation. This causes a significant frequency shift comparable to that which can be achieved with a switchable capacitor. In an embodiment, the invention thus allows a relatively large tuning range without use of switchable capacitors. Consequently, the invention allows satisfactory signal quality at moderate cost.

Another advantage of the invention relates to the following aspects. A resonance circuit generally introduces a signal loss, which increases with decreasing frequency. The switching of the switchable amplifier from the idle state to the active state causes a frequency decrease because a capacitance is switched in parallel with the capacitive part of the resonance circuit. In addition, this switching of the switchable amplifier causes a gain increase within an oscillation loop of which the resonance circuit and the switchable amplifier form part. This allows compensating for a signal loss increase due to the frequency decrease. Accordingly, in an embodiment of the invention, it is possible to obtain an oscillation signal whose amplitude is substantially frequency independent. Stated popularly, this embodiment of the invention strikes two flies in one blow: achieving a relatively large tuning range and compensating for signal-loss frequency dependency, which allows substantially constant oscillation signal amplitude. It should furthermore be noted that an embodiment of the invention allows a reduction in power consumption because one or more switchable amplifiers can be switched off when the frequency tunable arrangement operates at a relatively high frequency.

These and other aspects of the invention will be described in greater detail hereinafter with reference to drawings.

DETAILED DESCRIPTION

Figure 1:
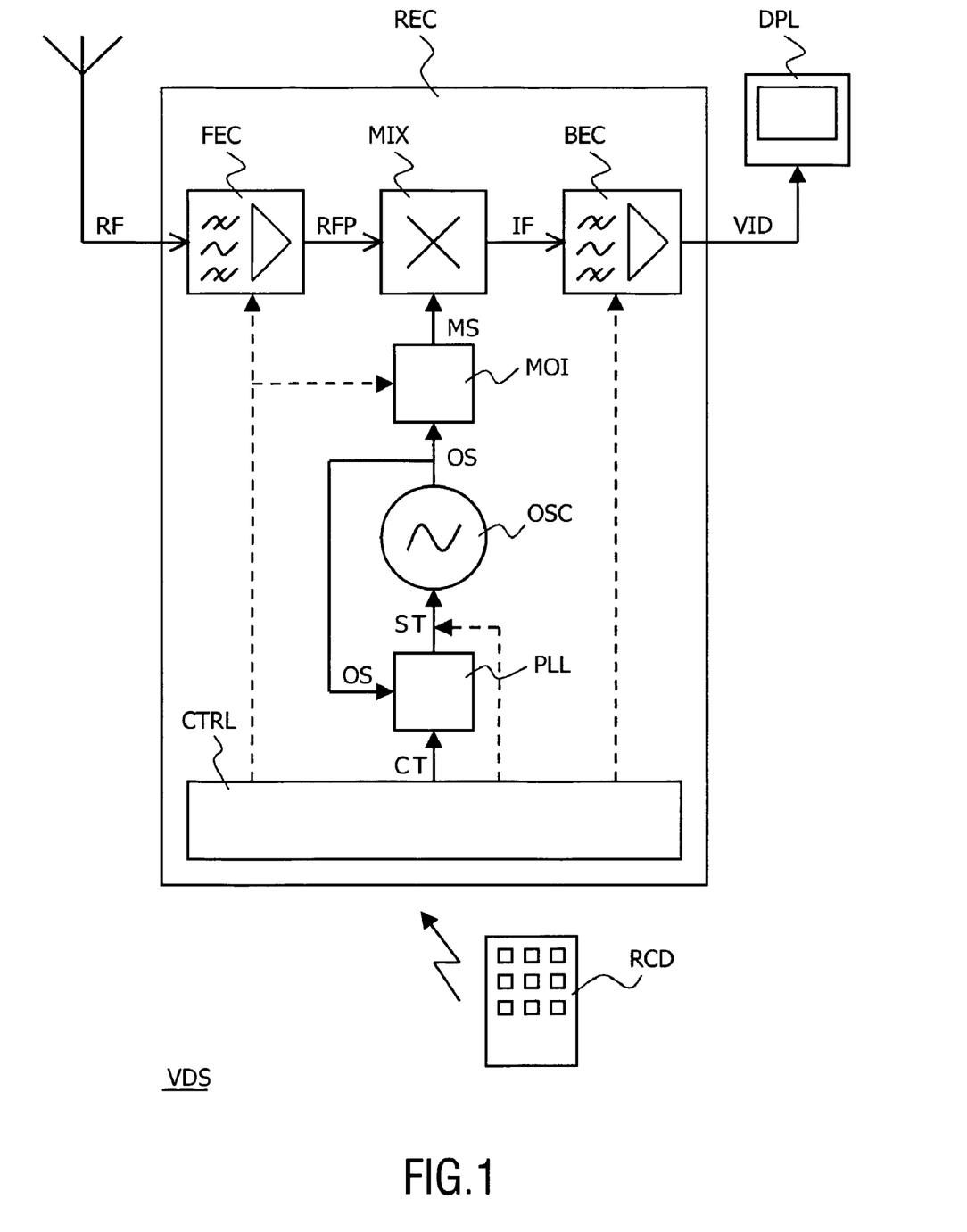
FIG. 1 is a block diagram that illustrates a video display set.

FIG. 1 illustrates a video display set VDS that comprises a receiver REC and a display device DPL. The receiver REC receives a radiofrequency spectrum RF and provides in response thereto a video signal VID. The display device DPL displays the video signal VID. The receiver REC may interact, for example, with a remote-control RCD via which the receiver REC can be tuned to a desired channel.

The receiver REC comprises a front-end circuit FEC, a mixer circuit MIX, and a backend circuit BEC. The aforementioned elements constitute a signal processing chain that derives the video signal VID from the desired channel in the radiofrequency spectrum RF. The receiver REC further comprises a control circuit CTRL, a phase-lock loop circuit PLL, an oscillator circuit OSC, and a mixer-oscillator interface circuit MOI. These elements constitute a tuning system that tunes the receiver to the desired channel. The oscillator circuit OSC forms the heart of the tuning system.

The receiver operates as follows. The front-end circuit FEC filters and amplifies the radiofrequency spectrum RF so as to obtain a processed radiofrequency spectrum RFP. The mixer circuit MIX, which receives the processed radiofrequency spectrum RFP, effects a frequency shift. Accordingly, the mixer circuit MIX provides an intermediate frequency spectrum IF that is a frequency-shifted version of the processed radiofrequency spectrum RFP. The mixer circuit MIX receives a mixer-oscillator signal MS that determines the frequency shift. The frequency shift, which the mixer circuit MIX effects, is such that the desired channel is frequency shifted to an intermediate frequency pass band. The backend circuit BEC, which receives the intermediate frequency spectrum IF, suppresses any signal that is outside the intermediate frequency pass band. The backend circuit BEC further effects a demodulation and, if needed, a decoding so as to obtain the video signal VID of the desired channel.

The tuning system tunes the receiver to the desired channel in the following manner. The oscillator circuit OSC provides an oscillator signal OS whose frequency determines the frequency shift that the mixer circuit MIX effects. The phase-lock loop circuit PLL receives the oscillator signal OS and a tuning command CT from the control circuit CTRL. The tuning command CT represents a target frequency. The phase-lock loop circuit PLL applies tuning signals ST to the oscillator circuit OSC. The tuning signals ST cause the frequency of the oscillator signal OS to correspond with the target frequency that the tuning command CT represents. The mixer-oscillator interface circuit MOI derives the mixer-oscillator signal MS from the oscillator signal OS. The mixer-oscillator interface circuit MOI typically comprises one or more buffer amplifiers. The mixer-oscillator interface circuit MOI may also comprise a frequency divider or a frequency multiplier so as to scale the frequency of the oscillator signal OS.

Figure 2:
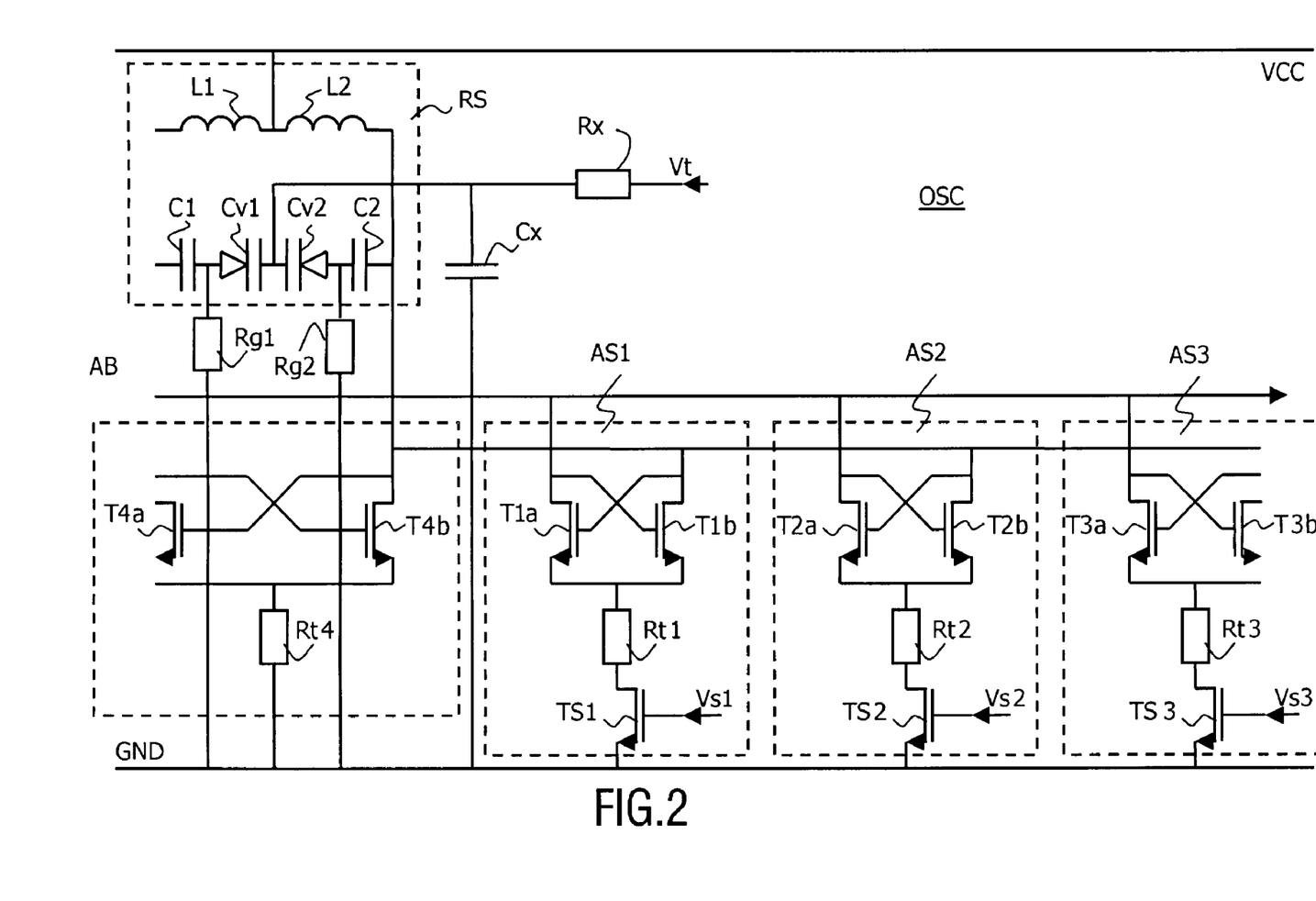
FIG. 2 is a circuit diagram that illustrates an oscillator circuit that forms part of the video display set.

FIG. 2 illustrates the oscillator circuit OSC. The oscillator circuit OSC comprises a resonance circuit RS, three switchable amplifiers AS1, AS2, AS3 and a basic amplifier AB. The resonance circuit RS comprises two inductances L1, L2, two fixed capacitances C1, C2 and two voltage-dependent capacitances Cv1, Cv2. The two fixed capacitances C1, C2 and the two voltage-dependent capacitances Cv1, Cv2 form a capacitive part of the resonance circuit RS. The three switchable amplifiers AS1, AS2, AS3 and the basic amplifier AB each comprise two amplifier transistors T of the field-effect type and a tail-current resistance Rt. Each switchable amplifier AS further comprises a switching transistor TS coupled in series with the tail-current resistance Rt. The oscillator circuit OSC comprises further resistances and capacitances for coupling, decoupling and biasing purposes: two ground-coupling resistances Rg1, Rg2, a decoupling capacitance Cx and a decoupling resistance Rx.

The oscillator circuit OSC operates as follows. The basic amplifier AB and the resonance circuit RS form an oscillation loop from which the oscillator signal OS is taken. The basic amplifier AB provides a transadmittance gain that over-compensates a signal loss in the resonance circuit RS. That is, the oscillation loop has a gain greater than +1, which constitutes a positive feedback.

The tuning signals ST, which are illustrated in FIG. 1, comprise a tuning voltage Vt and three switching voltages Vs1, Vs2, Vs3, which are illustrated in FIG. 2. The tuning voltage Vt is applied to the two voltage-dependent capacitances Cv1, Cv2 that form part of the resonance circuit RS. The three switching voltages Vs1, Vs2, Vs3 determine whether the three switchable amplifiers AS1, AS2, AS3, respectively, are in an active state or in an idle state.

Let it be assumed that switching voltage Vs1 has a high value. In that case, switching transistor TS1 forms a relatively low impedance. A tail current will flow through amplifier transistors T1$a$ and T1$b$. The tail-current resistance Rt substantially determines the tail current. The switching amplifier AS1 is in the active state.

Let it now be assumed that switching voltage Vs1 has a low value. In that case, switching transistor TS1 forms a relatively high impedance. Substantially no current will flow through amplifier transistors T1$a$ and T1$b$. The switching amplifier is in the idle state. The same applies to switching voltages Vs2 and Vs3 and switching amplifiers AS2 and AS3, respectively.

In the active state, switchable amplifier AS1 forms part of the oscillation loop and contributes to the gain of the oscillation loop. Furthermore, switchable amplifier AS1 will provide a capacitance that is in parallel to the capacitive part of the resonance circuit RS. Respective gate-source capacitances of the amplifier transistors in the switchable amplifier AS1 substantially determine that capacitance. The same applies to switching amplifiers AS2 and AS3.

In the idle state, switchable amplifier AS1 does not contribute to the gain of the oscillation loop. Switchable amplifier AS1 may provide a capacitance in parallel to the capacitive part of the resonance circuit RS. However, this capacitance will be relatively small or even insignificant. The same applies to switching amplifiers AS2 and AS3.

Figure 3:
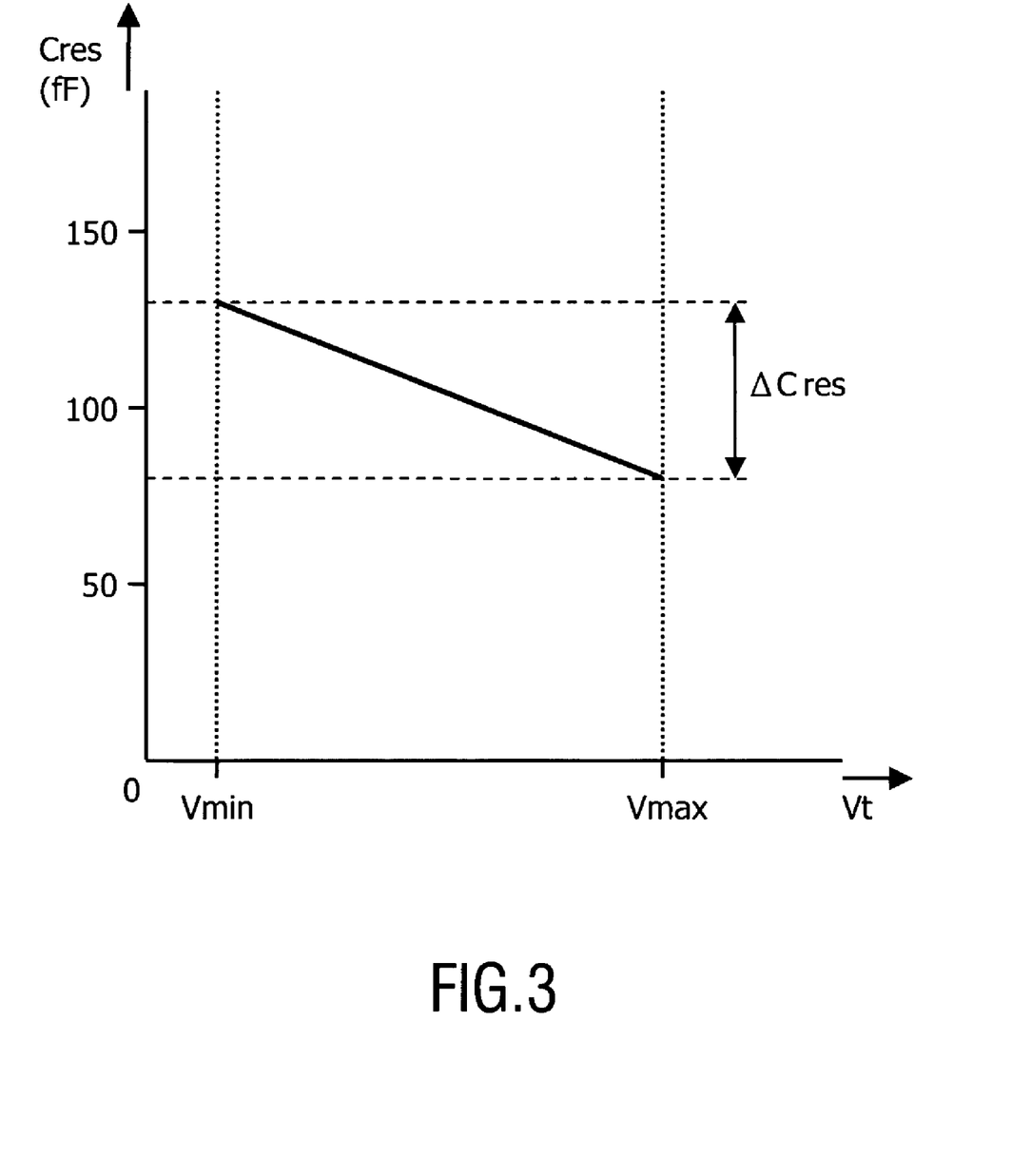
FIG. 3 is a graph that illustrates a tuning of a capacitive part of a resonance circuit that forms part of the oscillator circuit.

FIG. 3 illustrates that the capacitive part of the resonance circuit RS has a capacitance Cres that varies as a function of the tuning voltage Vt. The horizontal axis represents the tuning voltage Vt. The vertical axis represents the capacitance Cres of the capacitive part of the resonance circuit RS. The tuning voltage Vt can be varied in a range between a minimum tuning voltage Vmin and a maximum tuning voltage Vmax. The capacitance Cres of the capacitive part decreases if the tuning voltage Vt increases. The capacitance has a maximum value of approximately 130 femtoFarad (fF) at the minimum tuning voltage Vmin. The capacitance has a minimum value of approximately 80 fF at the maximum tuning voltage Vmax. Consequently, the capacitive part of the resonance circuit RS can be tuned throughout a capacitance range $\Delta$Cres of approximately 50 fF.

Figure 4:
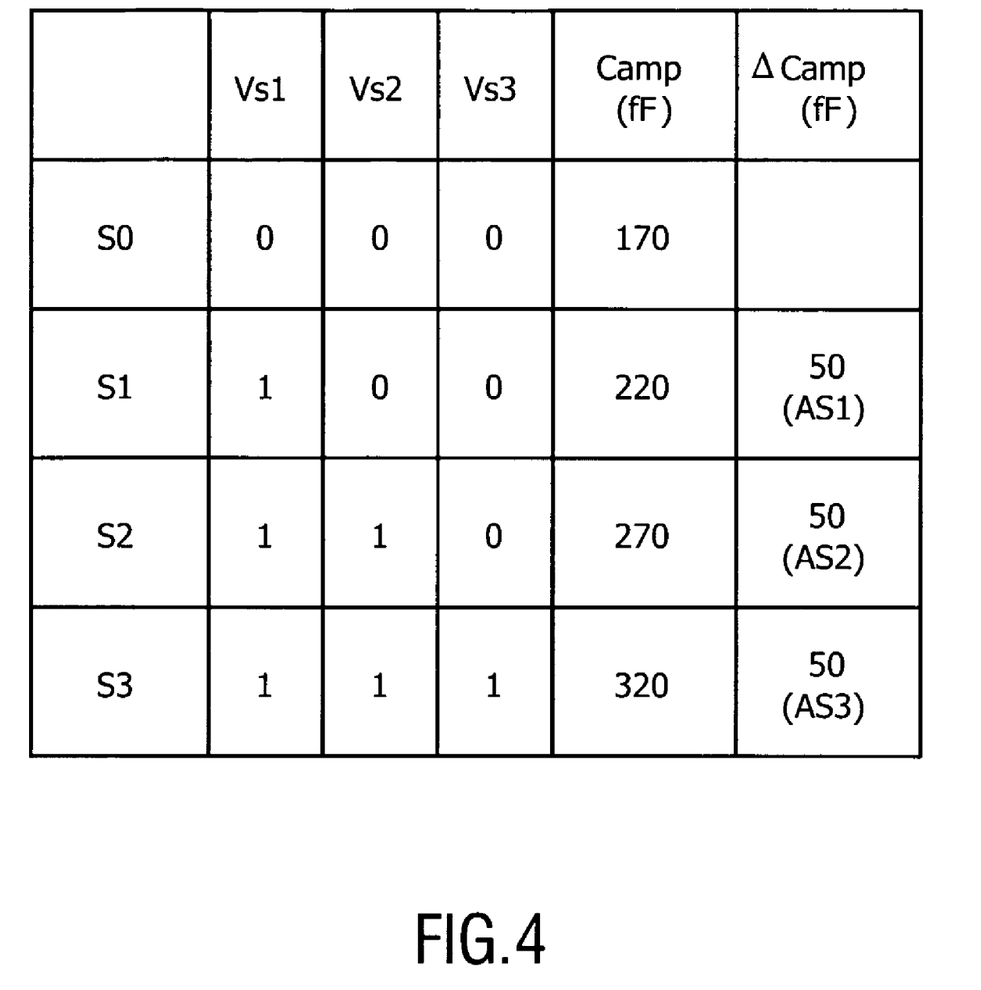
FIG. 4 is a graph that illustrates various operating modes of the oscillator circuit obtained through switching amplifiers.

FIG. 4 illustrates a total amplifier capacitance Camp for each of four operating modes S0, S1, S2, S3 of the oscillator circuit OSC. The total amplifier capacitance Camp is the capacitance that the basic amplifier AB and the three switchable amplifiers AS1, AS2, AS3 provide in parallel to the capacitive part of the resonance circuit RS. FIG. 4 is a table that comprises four lines. Each line represents a different operating mode. Three columns entitled "Vs1", "Vs2" and "Vs3" represent switching voltages Vs1, Vs2, and Vs3, respectively. Numeral 0 indicates that the switching voltage Vs has relatively low value. Numeral 1 indicates that the switching voltage Vs has a relatively high value. The column entitled "Camp" indicates the total amplifier capacitance Camp. The column entitled "ΔCamp" indicates a change of the total amplifier capacitance Camp when jumping to a lower row. The switching amplifier that causes this change is indicated between brackets.

In a basic operating mode S0, the three switching voltages Vs1, Vs2, Vs3 have a relatively low value. Consequently, the three switchable amplifiers AS1, AS2, AS3 are in an idle state. Only the basic amplifier AB contributes significantly to the total amplifier capacitance Camp, which is 170 fF.

In a one-switched operating mode S1, switching voltage Vs1 has relatively high value, whereas switching voltages Vs2 and Vs3 have a relatively low value. Consequently, switchable amplifier AS1 is in an active state, whereas switchable amplifiers AS2 and AS3 are in an idle state. Switchable amplifier AS1 contributes to the total amplifier capacitance Camp, which is 220 fF in the one-switched operating mode S1.

In a two-switched operating mode S2, switching voltages Vs1 and Vs2 have a relatively high value, whereas switching voltage Vs3 has a relatively low value. Consequently, switchable amplifiers AS1 and AS2 are in an active state, whereas switchable amplifier AS3 is in an idle state. Switchable amplifiers AS1 and AS2 contribute to the total amplifier capacitance Camp, which is 270 fF in the two-switched operating mode S2.

In a three-switched operating mode, the three switching voltages Vs1, Vs2, Vs3 have a relatively high value. Consequently, the three switchable amplifiers AS1, AS2, AS3 are in the active state. All three switchable amplifiers AS1, AS2, AS3 contribute to the total amplifier capacitance Camp, which is 320 fF.

FIG. 4 illustrates that the switching of any of the three switching amplifier AS1, AS2, AS3 from the idle state to the active state causes the total amplifier capacitance. Camp to increase 50 fF. Conversely, the switching of a switching amplifier AS from the active state to the idle state causes the total amplifier capacitance Camp to decrease 50 fF. It is recalled that the total amplifier capacitance Camp is in parallel to the capacitive part of the resonance circuit RS, which illustrated in FIG. 3. It is further recalled that the capacitance range ΔCres throughout which the capacitive part is tunable, is approximately 50 fF. The switching of a switching amplifier thus causes a capacitance variation in parallel to the capacitive part of the resonance circuit RS that substantially corresponds to the capacitive range ΔCres throughout which the capacitive part is tunable.

Figure 5:
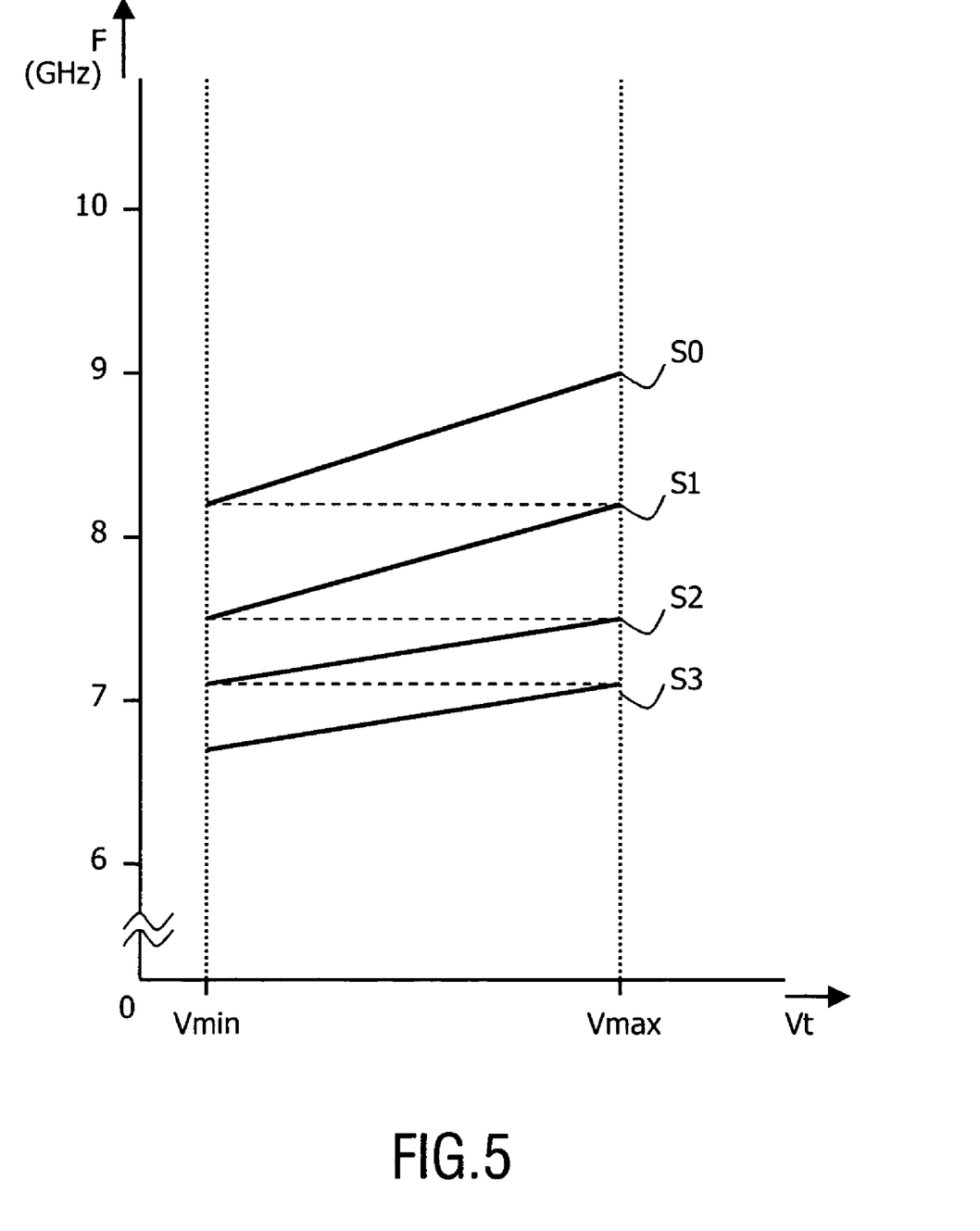
FIG. 5 is a graph that illustrates a tuning of the oscillator circuit.

FIG. 5 illustrates the frequency of the oscillator signal OS as a function of the tuning voltage Vt at different operating modes of the oscillator circuit OSC. The horizontal axis represents the tuning voltage Vt. The vertical axis represents the frequency of the oscillator signal OS. The resonance circuit RS has an inductive part of 12.5 nanoHenry (nH): the two inductances L1, L2 are 6.25 nH each. The capacitance Cres of the capacitive part of the resonance circuit RS is as illustrated in FIG. 3. The total amplifier capacitance Camp, which is illustrated in FIG. 4, is coupled in parallel to the capacitive part of the resonance circuit RS.

FIG. 5 illustrates that the frequency of the oscillator signal OS is tunable throughout a particular frequency band in each of the four operating modes S0, S1, S2, S3. The sum of the respective frequency bands constitutes an oscillator tuning range throughout which the oscillator circuit OSC is tunable. Preferably, the respective frequency bands slightly overlap so as to avoid a so-called tuning hole in the oscillator tuning range. The oscillator tuning range illustrated in FIG. 5 is approximately between 6.7 GHz and 9.0 GHz.

The frequency of the oscillator signal OS may be tuned in the following manner. Reference is made to FIG. 1. Let it be assumed that a user presses a program-number button on the remote control device RCD. In response, the control circuit CTRL receives a command to switch to a channel that is associated with the program number. The control circuit CTRL calculates the frequency that the oscillator signal OS should have in order to tune the receiver REC to the channel that the user requests. In addition, the control circuit CTRL determines which one of the four operating modes S0, S1, S2, S3 the oscillator circuit OSC should have. The control circuit CTRL may directly set the oscillator circuit OS in the appropriate operating mode by means of the three switching voltage Vs1, Vs2, Vs3 illustrated in FIG. 2. The control circuit CTRL may be in the form of, for example, a programmable circuit, which has been loaded with a set of instructions that causes the receiver REC to carry out the aforementioned operations.

The phase-lock loop circuit PLL may provide the tuning voltage Vt. The phase-lock loop circuit PLL may also modify any of the three switching voltages Vs1, Vs2, Vs3 if needed. An example is given with reference to FIG. 5. Let it be assumed that the tuning voltage Vt is equal to the minimum tuning voltage Vmin and that a lower frequency is required. In that case, the phase-lock loop circuit-PLL causes a jump to a lower curve, for example, a jump from the curve with reference sign S1 to the curve with reference sign S2. Conversely, the phase-lock loop circuit PLL will cause a jump to a higher curve if the tuning voltage Vt is equal to the maximum tuning voltage Vmax and a higher frequency is required. The phase-lock loop circuit PLL may, at least partially, also be in the form of a suitably programmed circuit.

The oscillator tuning range illustrated in FIG. 5 was achieved with the basic amplifier AB and the three switchable amplifiers AS1, AS2, AS3 having the following characteristics. The amplifier transistors T4$a$, T4$b$ in the basic amplifier AB are each 0.25 micrometer (μm) wide and 30 μm long. Tail-current resistance Rt4 provides a tail current of 6.57 milliAmpère (mA) for the two amplifier transistors T4$a$, T4$b$ in the basic amplifier AB. The two amplifier transistors T1$a$ and T1$b$ in switchable amplifier AS1 are each 2 μm and 12 μm long. Tail-current resistance Rt1 provides a tail current of 130 microAmpère (μA) for the two amplifier transistors T1$a$, T1$b$ in switchable amplifier AS1. The same applies to switchable amplifiers AS2 and AS3.

The above characteristics, which are given by way of example, are based on the following design considerations. Each of the three switchable amplifiers AS1, AS2, AS3 should preferably cause a substantial capacitance variation when switched between the idle state and the active state. This capacitance variation, which is in parallel to the capacitive part of the resonance circuit RS, significantly influences the frequency of the oscillator signal OS. A field effect transistor, through which a current flows, has a gate-source capacitance that is proportional to the product of channel width and channel length: channel width multiplied with channel length. The gate-source capacitance is relatively small if no current flows through the field effect transistor. In that case, an overlap between gate and source connections substantially determines the gate-source capacitance. In general, this overlap is relatively small.

The amplifier transistors of the three switchable amplifiers AS1, AS2, AS3 have a relatively long channel: 2 μm. Consequently, these transistors have a relatively large gate-source capacitance when a current flows through these transistors. This relatively large gate-source capacitance substantially causes the 50 fF capacitance variation illustrated in FIG. 4. This capacitance variation substantially corresponds to the capacitive range ΔCres throughout which the capacitive part of the resonance circuit RS is tunable, which is illustrated in FIG. 3.

The basic amplifier AB should provide sufficient gain to compensate for the signal loss in the resonance circuit RS. The gain of the basic amplifier AB is proportional to the channel width-to-length ratio of the two amplifier transistors T4a, T4b and the tail current that flows through these amplifier transistors. The two amplifier transistors T4a, T4b of the basic amplifier AB have a relatively short channel: 0.25 μm. Furthermore, the tail current is relatively large: 6.57 mA. The basic amplifier AB provides a transadmittance gain of approximately 4.0 milliSiemens (mS). This is sufficient to compensate for the signal loss in the resonance circuit RS, which is equivalent to an admittance of approximately 2.0 mS. The oscillation loop has thus a gain of approximately 4.0/2.0=2.

The gain of the oscillation loop should ideally remain constant when the oscillator circuit OSC is tuned throughout the oscillator tuning range. However, the signal loss in the resonance circuit RS is greater in a lower end of the oscillator tuning range than in a higher end. The three switchable amplifiers AS1, AS2, AS3 compensate for this signal-loss variation. In the lower end of the oscillator tuning range, the three switchable amplifier AS1, AS2, AS3 are all in the active state and, therefore, contribute to the oscillation loop gain. In the higher end of the oscillator tuning range, the three switchable amplifier AS1, AS2, AS3 are all in the idle state and, therefore, do not contribute to the oscillation loop gain.

The gain compensation that the three switchable amplifiers AS1, AS2, AS3 provide should preferably match the signal loss variation in the resonance circuit RS. Satisfactory matching can be achieved by appropriately setting the gain of each individual switchable amplifier AS. Each of three switchable amplifiers AS1, AS2, AS3 should preferably provide a gain that is substantially lower than the gain of the basic amplifier AB. If not, over-compensation might occur. The gain is proportional to the channel width-to-length ratio of the amplifier transistors TS and the tail current that flows through the amplifier transistors.

The amplifier transistors of the three switchable amplifiers AS1, AS2, AS3 have a relatively long channel: 2 μm. Furthermore, the tail current is relatively small: 130 μA. Each of the three switchable amplifiers provides a transadmittance gain of approximately 200 microSiemens (μS). This provides satisfactory compensation for the signal loss variation of the resonance circuit RS, which is approximately 100 (μS) throughout the frequency band of each of the four operating modes S0, S1, S1, S3 illustrated in FIG. 5.

It is to be noted that the channel width-to-length ratio of the two amplifier transistors T4a, T4b of the basic amplifier AB is relatively large: 30/0.25=120. In contradistinction, the channel width-to-length ratio of the amplifier transistors of the three switchable amplifiers AS1, AS2, AS3 is relatively small: 12/2=6. Consequently, the amplifier transistors of the basic amplifier AB provide a relatively high transadmittance gain and have relatively a low gate-source capacitance. The lower the respective gate-source capacitances of the two amplifier transistors T4a, T4b of the basic amplifier AB are, the wider the oscillator tuning range is. In contrast, the amplifier transistors of the three switchable amplifiers AS1, AS2, AS3 provide a relatively low transadmittance gain and have a relatively high gate-source capacitance.

Figure 6:
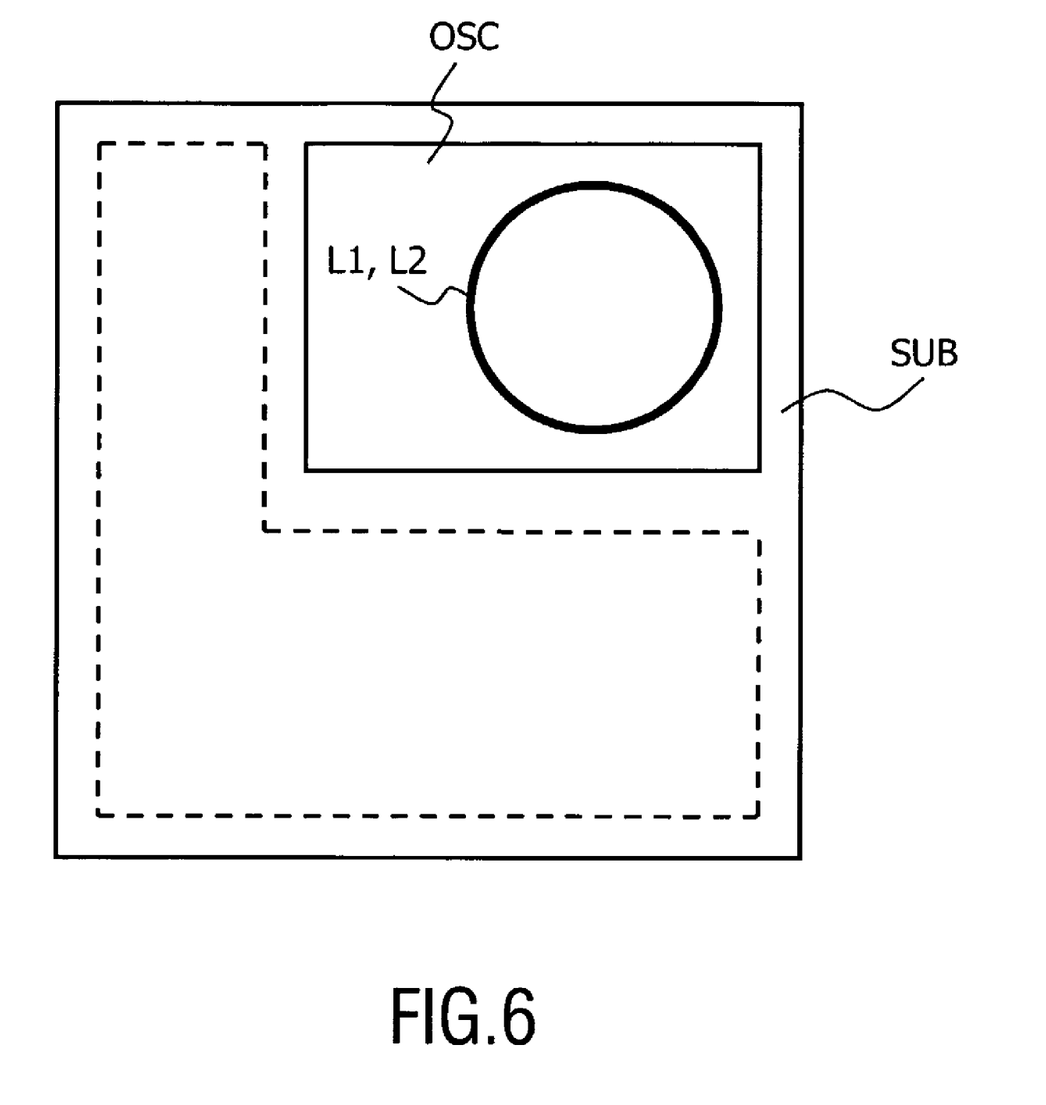
FIG. 6 is a top-view diagram of an integrated-circuit implementation of the oscillator circuit.

FIG. 6 illustrates an integrated circuit implementation of the oscillator circuit OSC. The oscillator circuit OSC is formed on an integrated circuit substrate SUB by means of, for example, etching and deposition techniques. A conductive path in the form of a loop constitutes the two inductances L1, L2, which are also illustrated in FIG. 2. The conductive path may be formed, for example, in a conductive interconnection layer formed on the integrated circuit substrate SUB. All other components illustrated in FIG. 2 can also be formed on the integrated circuit substrate SUB. The oscillator circuit OSC illustrated in FIG. 2, which has a relatively large oscillator tuning range as illustrated in FIG. 5, can thus be fully integrated, which is very cost-effective.

CONCLUDING REMARKS

The detailed description hereinbefore with reference to the drawings illustrates the following characteristics. A frequency-tunable arrangement (receiver REC) comprises a resonance circuit (RS) having a capacitive part (C1, C2, Cv1, Cv2) that is tunable throughout a capacitance range (ΔCres). A plurality of amplifiers (basic amplifier AB and switchable amplifiers AS1, AS2, AS3) is coupled to the resonance circuit so as to form an oscillation loop. At least one of the amplifiers is a switchable amplifier (AS1 for example) that is switchable between an active state and an idle state. The switchable amplifier causes a capacitance variation (ΔCamp) in parallel to the capacitive part of the resonance circuit when switched between the active and the idle state. The switchable amplifier is arranged so that the capacitance variation substantially corresponds to the capacitance range throughout which the capacitive part can be tuned.

The detailed description hereinbefore further illustrates the following optional characteristics.

The switchable amplifier (AS1) causes a gain variation in the oscillation loop when switched between the active and the idle state. The switchable amplifier is arranged so that the gain variation substantially compensates a signal-loss variation in the resonance circuit (RS) when the capacitive part (C1, C2, Cv1, Cv2) is tuned throughout the capacitance range (ΔCres). These characteristics further contribute to satisfactory signal quality because a relatively constant oscillation loop gain allows relatively low noise and low distortion throughout the oscillator tuning range.

The frequency-tunable arrangement (REC) comprises a plurality of switchable amplifiers (AS1, AS2, AS3) each of which causes a gain variation in the oscillation loop when switched between the active and the idle state, each switchable amplifier being arranged so that the gain variation substantially compensates a signal-loss variation in the resonance circuit (RS) when the capacitive part is tuned throughout the capacitance range (ΔCres). These characteristics further contribute to satisfactory signal quality because signal-loss variations in the resonance circuit can be compensated more precisely with a plurality of switchable amplifiers.

The aforementioned characteristics can be implemented in numerous different manners. In order to illustrate this, some alternatives are briefly indicated. There are different types of resonance circuits that can have a tunable capacitive part, such as, for example, a resonance circuit that comprises a crystal resonator. Amplifier transistors of the bipolar type can be used instead of field-effect transistors, although field-effect transistors are advantageous. It is also possible to use a mix of bipolar transistors and field-effect transistors. Field-effect transistors can be of the NMOS or PMOS type. An advantage of NMOS type field-effect transistors is that these provide a relatively high transadmittance gain. An amplifier may comprise a single transistor only instead of a differential pair of transistors, although a differential pair of transistors is advantageous. An amplifier may also comprise more than two transistors.

The dimensions of the amplifier transistors and the tail current values in the description are merely an example. There are numerous different values that equally provide satisfactory results. What is more, each different application will have a different set of values that provide satisfactory results. A skilled person having read the present description will be capable of readily determining appropriate values for a particular design. For example, let it be assumed that a design is based on field-effect transistors. The skilled person can calculate a target capacitance and a target gain that an amplifier should provide for a given set of oscillator specifications. The skilled person can then calculate appropriate dimensions of a field-effect transistor that forms part of the amplifier and the current that flows through the field-effect transistor, so that the amplifier provides the target capacitance and the target gain.

It should furthermore be noted that the claimed invention allows that the capacitance variation that the switchable amplifier causes when switched between the idle state and the active state, does not precisely correspond to the capacitance range throughout which the capacitive part of the resonance circuit can be tuned. For example, the oscillator circuit illustrated in FIG. 2 can be implemented so that the capacitance variation of the switchable amplifiers is 25 femtoFarad, one half of the capacitance range ΔCres, which is illustrated in FIG. 3, while still falling within the scope of the invention as claimed. In that case, the respective tuning ranges for the different operation modes will have a substantial overlap. The respective curves as shown in FIG. 5 will be closer to each other. The oscillator tuning range will be smaller. It is then possible to modify the oscillator circuit illustrated in FIG. 2 so that it comprises more switchable amplifiers, for example, six switchable amplifiers. In that case, the oscillator tuning range can be similar to that illustrated in FIG. 5.

Each switchable amplifier may be different. For example, in a field-effect transistor implementation, each switchable amplifier may have a pair of field-effect transistors whose dimensions are different from the respective pairs of field-effect transistors in the other switchable amplifiers. The oscillator circuit OSC illustrated in FIG. 2 may be modified so that the basic amplifier AB becomes switchable. It will then be possible to switch the basic amplifier AB between the idle and the active state too. Accordingly, the oscillator circuit can be put in a so-called sleep mode, which allows a reduction of power consumption.

There are numerous ways of implementing functions by means of items of hardware or software, or both. In this respect, the drawings are diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A frequency-tunable arrangement comprising:
   a resonance circuit having a capacitive part that is tunable throughout a capacitance range; and
   a plurality of amplifiers coupled to the resonance circuit so as to form an oscillation loop, at least one of the amplifiers being a switchable amplifier that is switchable between an active state and an idle state so as to cause a capacitance variation in parallel to the capacitive part of the resonance circuit, the capacitance variation substantially corresponding to the capacitance range throughout which the capacitive part can be tuned, wherein the switchable amplifier comprises a field-effect transistor in a common-source configuration, the field-effect transistor having a gate and a drain that are coupled in parallel to the capacitive part of the resonance circuit, wherein at least one of the amplifiers is a basic amplifier that comprises a field-effect transistor in a common-source configuration, the field-effect transistor having a gate and a drain that are coupled in parallel to the capacitive part of the resonance circuit, the field-effect transistor of the basic amplifier having a width-over-length ratio that is at least an order of magnitude greater than the width-over-length ratio of the field-effect transistor of the switchable amplifier.

2. A frequency-tunable arrangement as claimed in claim 1, wherein the switchable amplifier causes a gain variation in the oscillation loop when switched between the active and the idle state, the switchable amplifier being arranged so that the gain variation substantially compensates a signal-loss variation in the resonance circuit when the capacitive part is tuned throughout the capacitance range.

3. A frequency-tunable arrangement as claimed in claim 2, wherein the frequency-tunable arrangement comprises a plurality of switchable amplifiers each of which causes a gain variation in the oscillation loop when switched between the active and the idle state, each switchable amplifier being arranged so that the gain variation substantially compensates a signal-loss variation in the resonance circuit when the capacitive part is tuned throughout the capacitance range.

4. A frequency-tunable arrangement as claimed in claim 1, wherein the switchable amplifier comprises a differential transistor pair that is coupled to a switchable tail current source.

5. A frequency-tunable arrangement as claimed in claim 1, wherein the frequency-tunable arrangement comprises a tuning control circuit arranged to provide in response to a tuning command, a switch-control signal that determines whether the switchable amplifier is in the idle state or the active state, and a capacitance-control signal that tunes the capacitive part of the resonance circuit.

6. A frequency-tunable arrangement as claimed in claim 1, wherein the frequency-tunable arrangement comprises a signal processor circuit arranged to select a signal in a received radiofrequency spectrum on the basis of an oscillation signal from the oscillation loop.

7. A method of tuning a frequency-tunable arrangement that comprises:
   a resonance circuit having a capacitive part that is tunable throughout a capacitance range; and
   a plurality of amplifiers coupled to the resonance circuit so as to form an oscillation loop,
   the method comprising:
   a switching step in which at least one of the amplifiers is a switchable amplifier that is switched between an active state and an idle state so as to cause a capacitance variation in parallel to the capacitive part of the resonance circuit, the capacitance variation substantially corresponding to the capacitance range throughout which the capacitive part can be tuned, wherein the at least one of the amplifiers comprises a field-effect transistor in a common-source configuration, the field-effect transistor having a gate and a drain that are coupled in parallel to the capacitive part of the resonance circuit, wherein at least one of the amplifiers is a basic amplifier that comprises a field-effect transistor in a common-source configuration, the field-effect transistor having a gate and a drain that are coupled in parallel to the capacitive part of the resonance circuit, the field-effect transistor of the basic amplifier having a width-over-length ratio that is at least an order of magnitude greater than the width-over-length ratio of the field-effect transistor of the switchable amplifier.

8. A non-transitory computer program product for a frequency-tunable arrangement that comprises:
- a resonance circuit having a capacitive part that is tunable throughout a capacitance range; and
- a plurality of amplifiers coupled to the resonance circuit so as to form an oscillation loop,
- the non-transitory computer program product comprising a set of instructions that, when loaded into the frequency-tunable arrangement, enables the frequency-tunable arrangement to carry out a switching step in which at least one of the amplifiers is a switchable amplifier that is switched between an active state and an idle state so as to cause a capacitance variation in parallel to the capacitive part of the resonance circuit, the capacitance variation substantially corresponding to the capacitance range throughout which the capacitive part can be tuned, wherein the at least one of the amplifiers comprises a field-effect transistor in a common-source configuration, the field-effect transistor having a gate and a drain that are coupled in parallel to the capacitive part of the resonance circuit, wherein at least one of the amplifiers is a basic amplifier that comprises a field-effect transistor in a common-source configuration, the field-effect transistor having a gate and a drain that are coupled in parallel to the capacitive part of the resonance circuit, the field-effect transistor of the basic amplifier having a width-over-length ratio that is at least an order of magnitude greater than the width-over-length ratio of the field-effect transistor of the switchable amplifier.

9. A non-transitory computer program product as claimed in claim 8, wherein the switching step is a tuning control step in which in response to a tuning command, a switch-control signal is provided that determines whether the switchable amplifier is in the idle state or the active state.

10. An information-rendering apparatus comprising:
- a frequency-tunable arrangement as claimed in claim 1,
- a signal processing circuit for selecting a signal in a received radiofrequency spectrum on the basis of an oscillation signal from the oscillation loop,
- a demodulator for retrieving information from the signal selected, and
- a rendering device for rendering the information retrieved.

\* \* \* \* \*